United States Patent [19]

Vuilleumier

[11] 4,006,583
[45] Feb. 8, 1977

[54] ELECTRONIC DISPLAY DEVICE FOR TIMEPIECE AND THE LIKE

[75] Inventor: Raymond Vuilleumier, Neuchatel, Switzerland

[73] Assignee: Centre Electronique Horloger S.A., Switzerland

[22] Filed: June 18, 1975

[21] Appl. No.: 587,983

Related U.S. Application Data

[63] Continuation of Ser. No. 187,613, Oct. 8, 1971, abandoned.

[30] Foreign Application Priority Data

Oct. 30, 1970 Switzerland ............... 16170/70

[52] U.S. Cl. .................... 58/23 C; 58/23 A; 58/23 BA; 58/50 R
[51] Int. Cl.² ................ G04B 19/32; G04C 3/00
[58] Field of Search ........... 58/23 R, 23 A, 23 C, 58/50 R, 50 A, 23 BA

[56] References Cited

UNITED STATES PATENTS

| | | | |
|---|---|---|---|
| 3,078,364 | 2/1963 | Neugebauer | 58/50 R X |
| 3,116,883 | 1/1964 | Neugebauer | 58/50 R X |
| 3,129,415 | 4/1964 | McKnight | 58/23 C X |
| 3,485,033 | 12/1969 | Langley | 58/23 R |
| 3,608,301 | 9/1971 | Loewengart | 58/23 A |
| 3,630,015 | 12/1971 | Lehovec | 58/23 |
| 3,672,155 | 6/1972 | Bergey et al. | 58/50 R |

*Primary Examiner*—Stanley J. Witkowski
*Attorney, Agent, or Firm*—Stevens, Davis, Miller & Mosher

[57] ABSTRACT

Disclosed is a light emitting diode display system powered by ambient light. This solid state electronic display device comprises an ambient irradiated photovoltaic battery energizing through an electronic adapter circuit light emitting diodes selectively chosen to display the desired information. The adapter circuit transforms the electrical power continuously supplied by the photovoltaic battery into energy pulses which are periodically applied to the display. In addition, the adapter circuit automatically adjusts the display brightness in accordance with the ambient illumination level. At low and zero light levels, the electronic display device maintains a visible display by deriving power from a secondary energy source.

15 Claims, 5 Drawing Figures

ELECTRONIC DISPLAY DEVICE FOR TIMEPIECE AND THE LIKE

This is a continuation of application Ser. No. 187,613, filed Oct. 8, 1971 and now abandoned.

This invention applies to solid state timepieces and in particular to electronic watches where low power consumption of the display is mandatory. The invention concerns a light emitting diode display system which derives its power from the ambient light. This electronic display device employs an ambient irradiated photovoltaic battery connected to an electronic adapter circuit to power in timed sequence the light emitting diodes of the display. In addition, the electronic display device automatically adjusts the display brightness in accordance with the ambient illumination level. At low and zero light levels, the display device maintains a visible contrast by deriving power from a secondary energy source, i.e. the chemical battery of the electronic timepiece.

Numerous effects may be used to provide an electronic display. However, few of them favourably fulfil the conditions of energy, voltage, stability, long-life and integrability required by horological display devices. These display systems can be classed into two categories, called passive and active respectively.

Active systems themselves emit radiation which excites the eye. In these systems, the ambient illumination can be considered as a luminous background noise which must be overcome in order to ensure a visible display. In view of the intense ambient solar radiation, it is evident that active systems must overcome high degrees of illumination and, consequently, consume relatively large quantities of energy. The use of demand switches and light-shields has heretofore been proposed so as to reduce the energy requirement of active systems by reducing the display time or the level of illumination. However, these solutions are imperfect and inconvenient.

Passive systems utilize ambient illumination as the source of excitation of the eye. Because of this, they are perceptible only in the presence of incident radiation and require a switching energy to change the state of transmission or reflection. Some passive systems, such as those using liquid crystals, need only a low standby power.

However, it is difficult to fulfill the conditions of voltage, long-life and integrability with these systems. Active systems using electroluminescent elements do not, on the other hand, have these disadvantages.

It appears then that an horological display can be provided by a system which combines the advantages of both active and passive systems. To achieve this result, which is the main object of this invention, an electronic variant of a passive system using an active display is disclosed herein. By a judicious dimensioning of the system, it is possible to provide a contrasted perception which is independant of the level of illumination and analogous to that obtained by means of a passive system. In addition, it is possible to satisfy the energy requirements of an automatically activated and continuous electroluminescense display.

The aforementioned electronic variant or so-called electronic display device according to the invention applies to electronic timepieces and the like which contain electronic circuits for selecting the display elements. The electronic display device comprises an electroluminescent display which is electronically coupled to and efficiently powered by an ambient irradiated photovoltaic battery when exposed to radiation in excess of a given threshold. In addition, the device contains a non-photovoltaic secondary energy source which energizes the display at low and zero light levels. The adapter circuit which couples and efficiently transfers the power supplied by the energy sources to the display, transforms, by use of storage and electronic triggering means, the continuously supplied power into energy-pulses which are periodically applied to the display elements corresponding to the desired information to produce a sequence of light pulses. If the frequency of the light pulses is higher than that corresponding to the persistance of the eye, the display appears to be operated continuously. At sufficiently low frequencies, the display is perceived as a series of flashes.

Several embodiments of the invention will now be described, by way of example, with reference to the accompanying drawings, in which.

Figure 1:
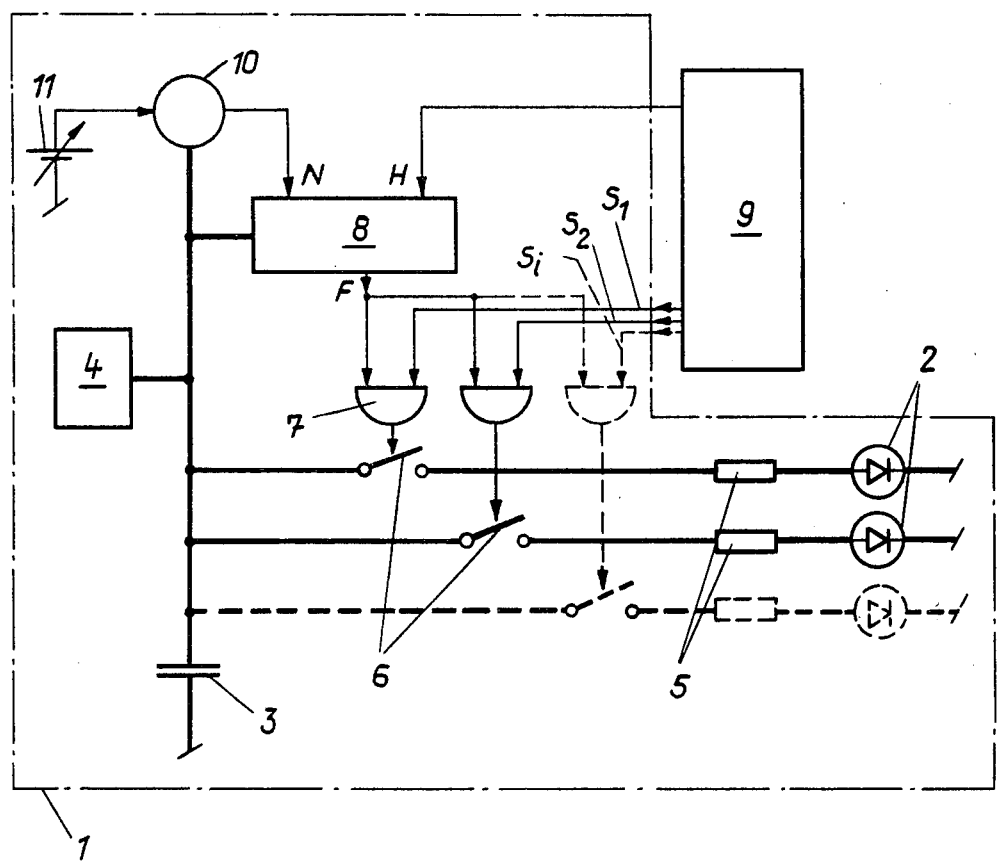
FIG. 1 is a block diagram of a first embodiment in which energy for the display device is supplied solely by means of a photovoltaic battery.

Referring to FIG. 1, an electronic display device for a watch comprises a set of electroluminescent elements 2, for example diodes, located on the watch to provide an analog, digital or alpha-numeric type of display pattern. These elements are powered through resistors 5 and electronic switches 6, by a capacitor 3 charged by a photovoltaic battery 4. The resistors 5 serve to equalize the currents flowing in the elements 2. The switches 6 are connected to and controlled by the outputs of AND gates 7 each with two inputs. One of these inputs is supplied with an output F of a logic circuit 8 and the other input by one of the element selection signals S produced by a counting and decoding circuit 9 of the watch. The operation of circuit 9 is well known in the art. The signals S indicate at each instant which of the elements 2 must be on and which must be off in order to display the desired time information. The logical circuit 8 carries out the logic function.

$$F = N(H + F)$$

where $F_{110}$ is a delayed output, N being a signal produced by a comparator 10 which compares the voltage across the capacitor 3 to that of an adjustable reference source 11, and H being a periodic clock signal produced by the circuit 9. F appears on both sides of the equation because of the feedback arrangement shown in FIG. 3. The comparator 10 produces a logic signal N of value "1" during the time the voltage across the capacitor 3 exceeds that of the reference source 11. As shown in heavy lines in FIG. 1, in addition to the elements 2, the capacitor 3 energizes both the logic circuit 8 and the comparator 10, while the circuit 9 and the time base (not shown) of the watch are separately powered by another source, not shown.

The manner in which the circuit of FIG. 1 functions is explained with reference to FIG. 2, in which the first graph shows the voltage across the capacitor 3, designated by $V_c$, the second graph shows the output signal N of the comparator 10, the third graph shows the time signal H produced by the circuit 9, and the fourth graph shows the signal F produced by the logical circuit 8.

To ensure an efficient and luminous output of the elements 2, the current and consequently the voltage applied to the terminals of the electronic switches 6 must reach a certain efficiency threshold designated by threshold current $I_s$ and threshold voltage $V_s$, respectively. The excitation current of the electroluminescent elements or diodes has two components, one radiative, the other non-radiative. A radiative efficiency threshold for the current can be defined as the current required for the radiative component to be ten times greater than the non-radiative one.

The adjustable reference source 11 is set to provide the required threshold voltage $V_s$ which is compared, by the comparator 10, with the voltage $V_c$ across the capacitor 3. When this latter exceeds the threshold voltage $V_s$, the comparator 10 produces a signal N indicating that the elements 2 can be switched on. The clock signal H produced by the circuit 9 has a sufficiently high frequency so that its period T is less than the duration of persistence of the retina of the eye. When the signal N has the logic value "1", namely when the voltage $V_c$ is greater than the voltage $V_s$, the circuit 8 generates a pulse signal F as soon as the clock pulse H is applied. The signal F is supplied until the signal N reassumes the logic value "0". This fields, with increasing amounts of ambient radiation, a proportional increase in the pulse width of F and, consequently, of the brightness of the elements 2 as well as an increase in the mean value of the voltage $V_c$.

When the level of ambient becomes sufficiently intense that the voltage $V_c$ no longer drops to $V_s$, the signal F becomes continuous and the current supplied to the elements 2 ceases to the width modulated. This direct current changes in amplitude in accordance with the current provided by the photovoltaic battery.

In addition to the power economy achieved, the system presented here functions as a passive system with a constant contrast above a given illumination threshold. This result is obtained by automatically adjusting the display brightness to the ambient radiation.

Figure 3:
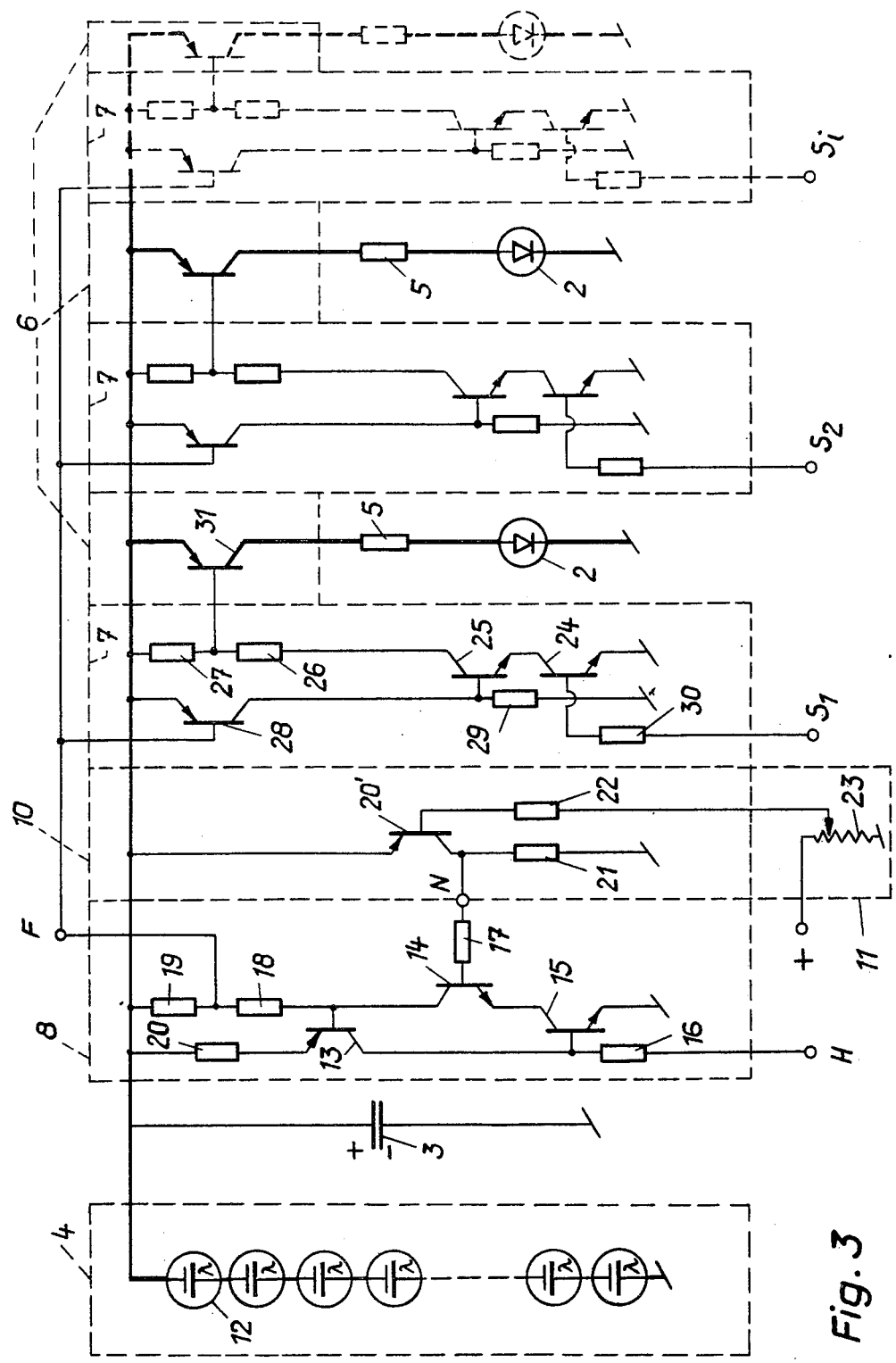
FIG. 3 is a detailed circuit diagram of the embodiment shown in FIG. 1.

FIG. 3 is a detailed circuit diagram of the embodiment shown in FIG. 1, the elements corresponding to FIG. 1 being shown by the same reference indicia as in the latter, namely the electroluminescent elements or diodes 2, the capacitor 3, the photovoltaic battery 4, the resistors 5, the switches or contacts 6, the AND gates 7, the logic circuit 8, the comparator 10 and the reference source 11.

The photovoltaic battery 4 comprises several semiconductor elements 12 in series, the number being chosen to provide, as soon as a minimum degree of radiation is present, a working voltage exceeding the efficiency threshold voltage $V_s$ of the diodes 2.

The logical circuit 8 comprises a PNP transistor 13, and two NPN transistors 14, 15, the input signals H and N being applied to the bases of transistors 15 and 14 respectively via resistors 16 and 17, and the output signal F being collected at the median point of a voltage divider formed by two resistors 18, 19. The feedback transistor 13 is connected to the positive side of the capacitor 3 via a resistor 20.

The comparator circuit 10 comprises a PNP transistor 20' mounted with the collector connected to a load 21, the output signal N being produced by the collector. The reference signal is applied to the base, via a resistor 22, from the reference source 11 including a potentiometer 23.

The AND logical circuits 7 each comprise a first NPN transistor 24 in series with a second NPN transistor 25 and with two resistors 26 and 27. The base of the transistor 25 is controlled by the collector of a PNP transistor 28 connected in series with a resistor 29. Each signal $S_1, S_2, \ldots S_t$ is applied to the base of a corresponding transistor 24 via a resistor 30, and the signal F is applied directly to the bases of the transistors 28.

The switches or contacts 6 each consist of a switching transistor 31 the base of which is controlled by the current flowing through the two resistors 26 and 27.

The embodiment described with reference to FIGS. 1 to 3 does not operate in the dark or at low ambient light levels. By the addition of an auxiliary energy source, such as a chemical battery, operation is possible over the entire ambient light range.

Figure 4:
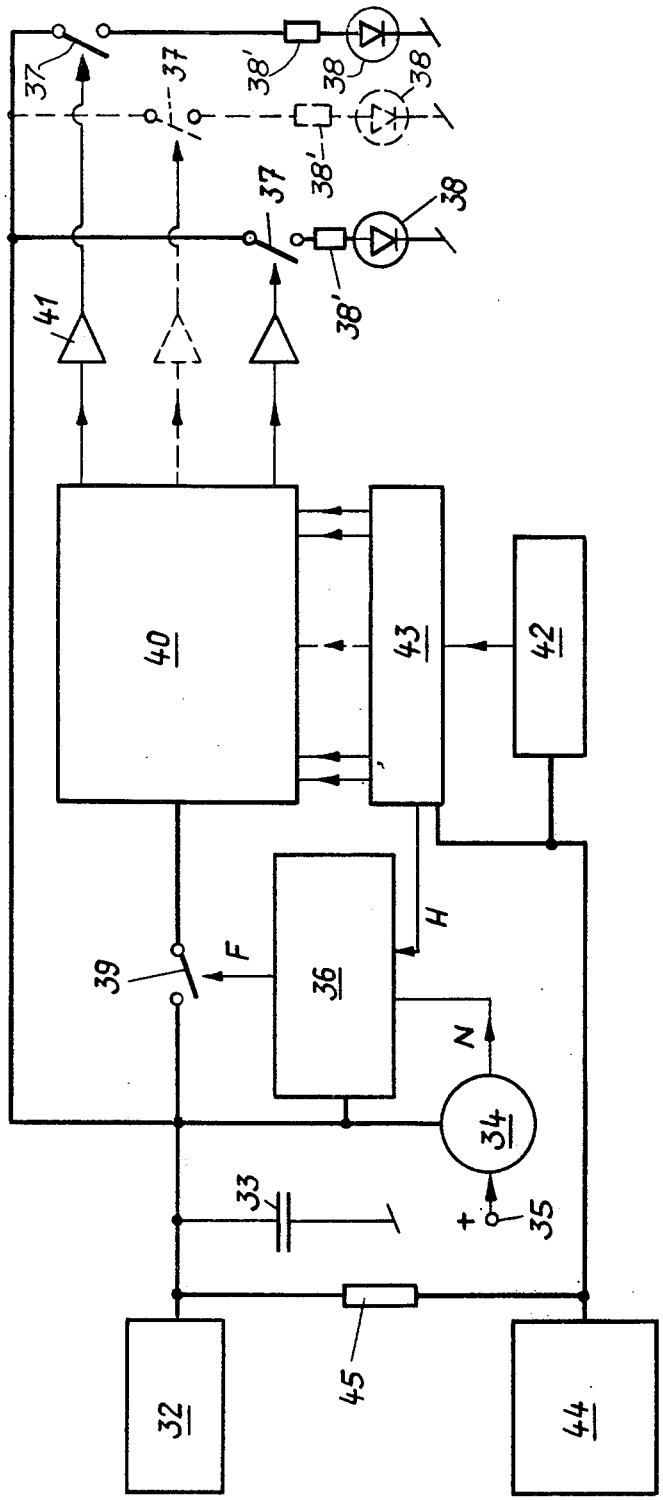
FIG. 4 is a block diagram of a second embodiment in which additional energy for the display device is assisted by an internal source.

Such an embodiment is shown in FIG. 4. The electronic display device shown comprises a photovoltaic battery 32 charging a capacitor 33, and a comparator 34 comparing the potential of voltage across the capacitor 33 with that of a reference source 35. This comparator provides an output signal N which has a logic value "1" when the voltage across the capacitor 33 is greater than that of the reference source 35. The logic circuit 36 receives two input signals N and H and produces an output signal F defined by $$F = N(H + F)$$

H being a clock signal which will be defined hereinafter. The main energy flow between the various parts is shown in heavy lines.

The capacitor 33 energizes, via switches or contacts 37 and resistors 38', electroluminescent elements or diodes 38 and, via a switch or contact 39, a decoder circuit 40. The decoder outputs determine which of the elements 38 are to be on or off. They are applied to the switches 37 via amplifiers 41. The watch also comprises a time base generator, or oscillator, 42 and a counter circuit 43 (which produces the clock signal H) powered by an internal secondary energy source 44. The photovoltaic battery 32 and the source 44 are connected via a resistor 45.

Figure 2:
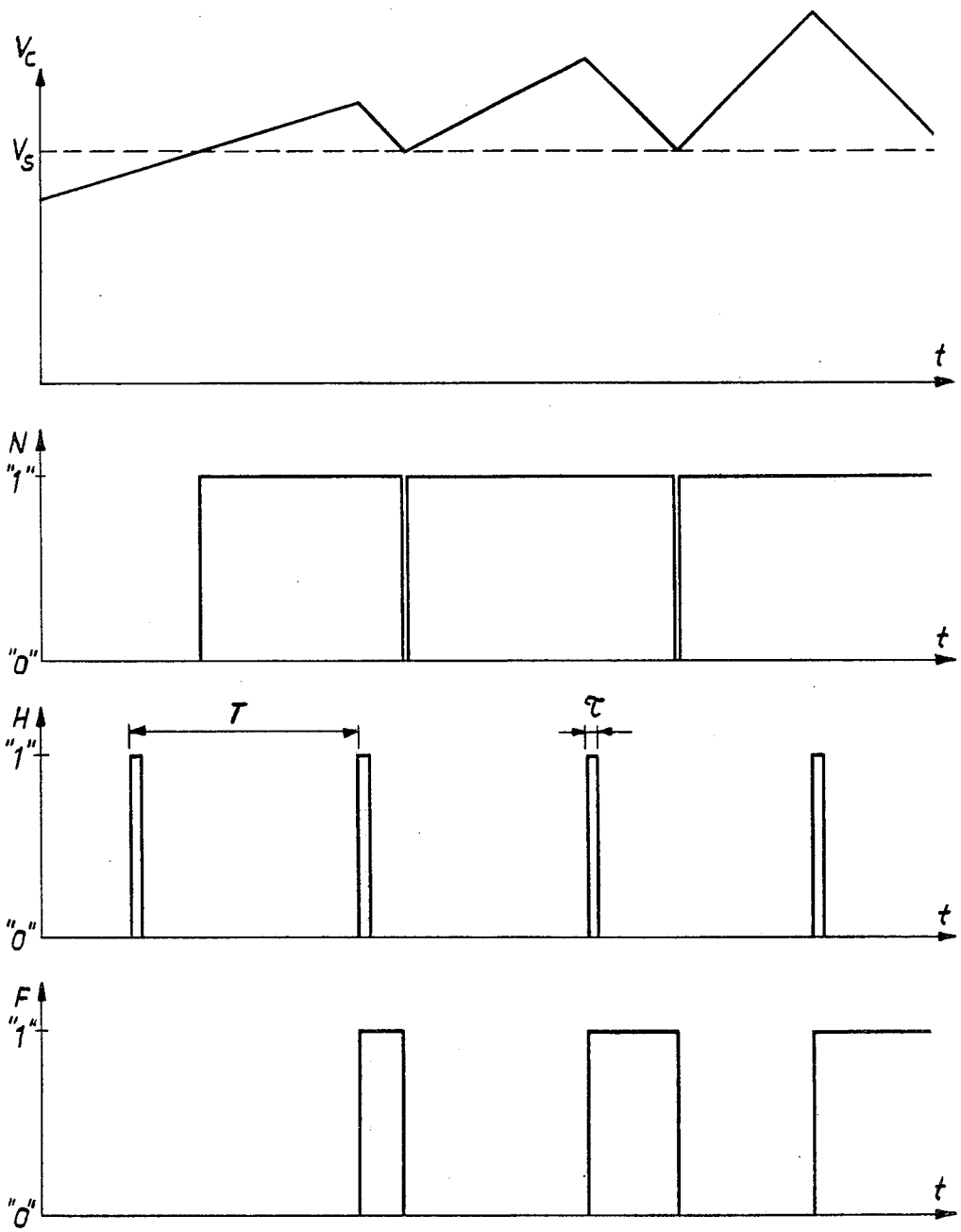
FIG. 2 is an explanatory diagram comprising a series of graphs to illustrate operation of the device according to FIG. 1.

The parts 32, 33, 34, 35, and 36 function as for the corresponding parts of the embodiment according to FIGS. 1 to 3.

It can be shown that to obtain a constant contrast at all levels of the ambient illumination, it is sufficient to supply the photovoltaic battery 32 with a constant additional power equal to $V_s I_1$. The threshold voltage $V_s$ is equal to the open circuit voltage of the battery 32 at the illumination level $E_1$ (which determines the number of battery elements in series). The current $I_1$ is the short-circuit current of the battery 32 at the illumination level $E_1$. $E_1$ is the upper limit of illumination that the internal secondary source 44 can overcome for a long period of time. The additional power is provided by connecting the internal secondary source 44 to the battery 32 via the resistor 45. The mean current passing through the resistor 45 is practically constant and equal to $I_1$ at low illumination, since the voltage across the capacitor 33 varies only slightly with respect to $V_s$ (see FIG. 2, first graph). At strong luminous intensities, the means current flowing from the source 44 through the resistor 45 diminishes, which is energetically advantageous and does not alter the functioning of the device, given that this current is small with respect to that supplied by the photovoltaic battery 32.

The source 44 can be recharged at strong luminous intensities, if the voltage at the terminals of the capacitor 33 becomes greater than that of the source 44.

Instead of generating the trigger signal for the electroluminescent element switches 37 through gate as shown in the embodiment of FIGS. 1 to 3, this signal is obtained directly from the decoder 40 supplied with an input signal by electronic switch 39, the latter being triggered by the signal F. The decoder outputs are then amplified by amplifiers 41 before triggering the switches 37.

The embodiment according to FIG. 4 is elegant in its simplicity. At low ambient illumination levels, however, a fraction of the power delivered for the display by the secondary energy source is diverted into the photovoltaic battery. This can be avoided by inserting a diode in series at the output of the photovoltaic battery or by disconnecting the photovoltaic battery when the ambient illumination falls below the level $E_1$. A constant brightness of the electroluminescent elements 38 at illumination levels below $E_1$ could be unpleasant at very low illumination levels, due to overcontrast. For phsychological reasons, it may be necessary to maintain, even below $E_1$, a certain relationship between the brightness of the elements and the ambient illumination. This relationship could be continuous in nature in order to maintain constant contrast, or could be accomplish through a series of successive steps. The introduction of a minimal emission brightness is proposed, since the eye has slow to adjust at very weak illuminations.

Figure 5:
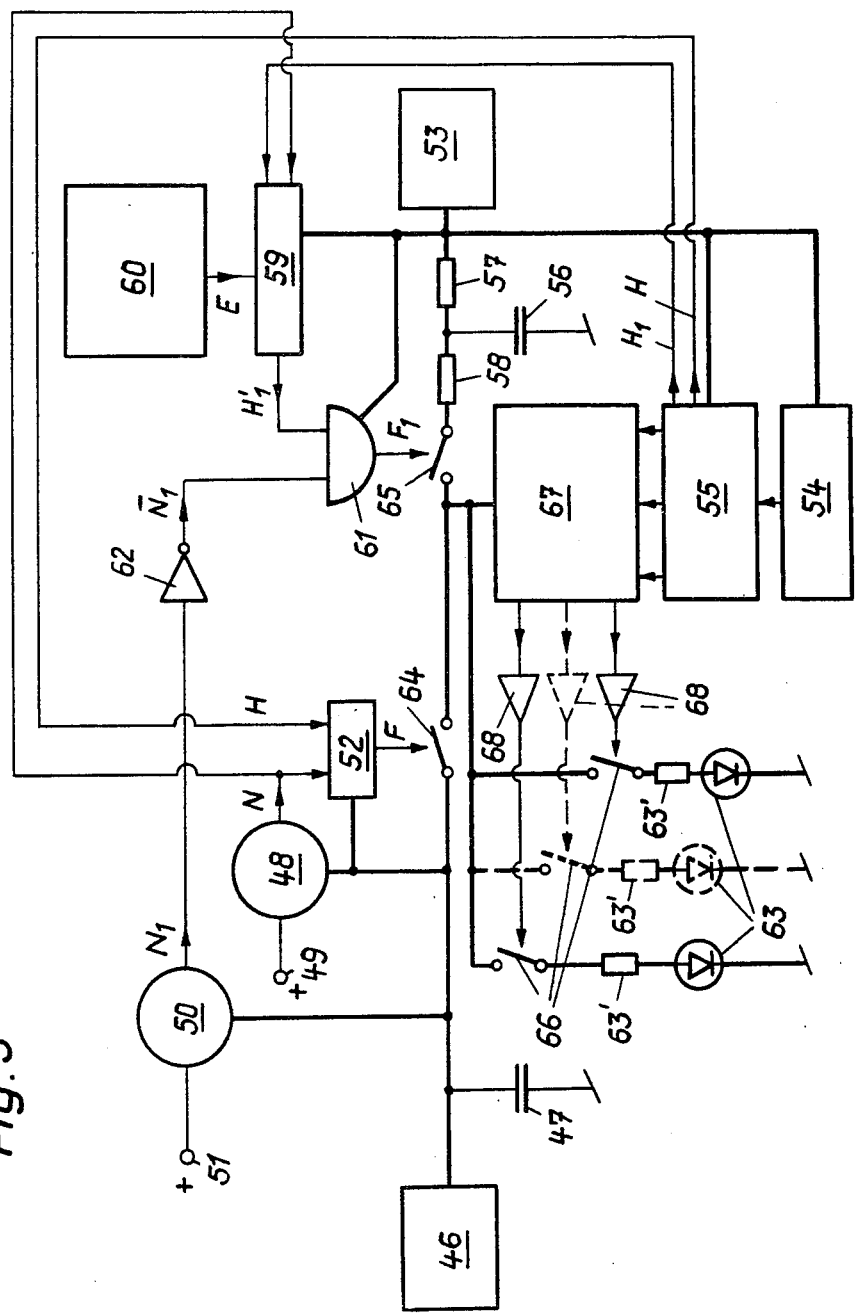
FIG. 5 is a block diagram of a third embodiment, in which additional energy for the display device is also supplied by an internal secondary energy source.

FIG. 5 is a block diagram of an embodiment in which additional energy is supplied by a secondary energy source; as soon as the energy supplied by the photovoltaic battery becomes insufficient to maintain a constant contrast down to the previously mentioned minimal emission brightness.

The device shown in FIG. 5 comprises a photovoltaic battery 46 supplying energy to, as shown in heavy lines: a first capacitor 47; a first comparator 48 comparing the voltage across the capacitor 47 with a first reference voltage 49 and providing a signal N of logical value "1" when the voltage across the capacitor 47 is greater than the reference voltage 49; a second comparator 50 comparing the voltage across the capacitor 47 with a second reference voltage 51 higher than the reference voltage 49 and providing a signal $N_1$ of logic value "1" when the voltage across the capacitor 47 is higher than the second reference voltage 51; and a logic circuit 52 receiving two input signals N H and and giving an output signal F defined by

F=N (H + F)

H being a first clock signal supplied by a counter circuit 55 of the watch.

The device comprises an internal secondary source of energy 53 supplying energy to, as shown in heavy lines: a time base 54; the counter circuit 55; a second capacitor 56 connected between two resistors 57 and 58; a modulator 59 controlled firstly by a second clock signal $H_1$ supplied from the counter circuit 55, secondly by the signal N and thirdly by a signal E produced by an ambient illuminated photo detector 60; and an AND logic gate 61. One input of gate 61 receives a signal $\overline{N_1}$ delivered by an inverter 62 connected to the output signal $N_1$ of the second comparator 50. The other input receives the output signal $H_1'$ of the modulator 59. The gate 61 provides an output signal $F_1$.

The electroluminescent elements or diodes 63 in series with resistors 63' are connected to the two capacitors 47 and 56, through two corresponding electronic switches or contacts 64 and 65, respectively and through electronic switches or contacts 66 for each of the elements 63. The switches 64 and 65 are controlled by the output signals F and $F_1$. The outputs of circuit 67 control switches 66 through amplifiers 68.

The operation of the device is as follows: The number of cells forming the photovoltaic battery is chosen so as to produce an open circuit voltage $V_s$ at a certain ambient illumination level $E_1$. Power is supplied by the internal secondary source 53 when the level of illumination is smaller than a second predetermined level $E_2$ higher; than $E_1$, in order to maintain a perceptible contrast at illumination levels lower than $E_2$. At illumination levels intermediate between $E_1$ and $E_2$ as for those below $E_1$, the current produced by the photovoltaic battery is insufficient to power the display device. This level $E_2$ corresponds to a certain value of the voltage $V_R$ across the capacitor 47 at the moment when the signal $H_1'$ is applied to the AND logic gate 61 producing the signal $F_1$. The second adjustable reference source 51 is set at voltage $V_R$. The signal $H_1'$ has the same frequency as H but is not necessarily in phase therewith. When the voltage across capacitor 47 reaches $V_R$, $\overline{N_1}$ is "0" and N is "1". The switch 65 actuated by $F_1$ remains open. The switch 64 controlled by F operates as in the case of the embodiment according to FIGS. 1 and 3. When $N_1$ is "0", $\overline{N_1}$ is "1" and the switch 65 is actuated according to the signal $H_1'$. Two cases can arise: N equal to "1" or "0". When N is "1", the modulator 59 supplies a pulse signal $H_1'$ with a constant pulse width casusing the internal source 53 supply a constant power complementary to that supplied by the photovoltaic battery 46 in order to maintain a constant contrast visibility for the electroluminescent display 63. When N is "0", the photovoltaic battery 46 is disconnected by opening of the switch 64 controlled by the signal F. In this case, the width of the pulses $H_1'$ is reduced in proportion to the ambient illumination, or by successive steps, depending on the mode of operation of the modulator 59, until the width corresponds to that necessary to provide the minimum threshold brightness. This control of the width of the pulses $H_1'$ is determined by the signal E from the detector 60.

As a variant of the embodiment according to FIG. 1, it would be possible to operate the display in a flashing mode by using a clock signal H of sufficiently low frequency. A frequency of one flash per second could serve as a second indication for timekeeping and would attract attention to the display. The power continuously supplied by the photovoltaic battery is stored between pulses, whereby in the case of low frequency operation the period between pulses is many times that of the persistance of the eye. This mode of excitation is particularly advantageous, in that it reduces the average power consumption. For a given display, this mode of operation allows a reduction of the surface area of the photovoltaic battery. Conversely, for a given surface area of the photovoltaic battery a display having a larger area or having elements with lower efficiency can be used.

What is claimed is:

1. In an electronic timepiece display apparatus having a clock circuit for generating a clock signal and a plurality of display signals, each generated display signal corresponding to a desired electroluminescent element to be activated, the improvement comprising: a plurality of electroluminescent display elements; a photovoltaic source generating a voltage as a function of the amount of ambient light irradiating said source;
    storage means coupled to said photovoltaic source for storing the output of said photovoltaic source and for producing a voltage in relation to the stored source output;
    logic circuit means coupled to said photovoltaic source and to said clock circuit for generating an output signal in the form of a series of pulses which are synchronized with the clock frequency of said clock circuit and width modulated in accordance with the output of said photovoltaic source;
    switching means coupled between said storage means and each of said electroluminescent elements; and
    means coupling an output of said logic circuit means and the display signal generating portion of said clock circuit to said switching means to activate a particular electroluminescent element by the corresponding display signal appearing at the display signal outputs of said clock circuit coincident with a signal appearing at the output of said logic circuit means.

2. An electronic timepiece display apparatus according to claim 1, further comprising: means for generating a reference voltage; and comparator means for comparing the voltage across said storage means with said reference voltage and for generating a logic output signal when the voltage across said storage means is greater than said reference voltage; wherein said logic circuit has a first input coupled to the logic output of said comparator means and a second input coupled to the clock signal output of said clock circuit, said logic circuit generating an output signal commencing with the appearance of a clock signal at said clock signal output subsequent to and coincident with a signal appearing at said comparator output and ending with the disappearance of said signal at said comparator output.

3. The apparatus according to claim 2, wherein said means coupling said logic circuit output and said display signal generating portion to said switching means comprises a plurality of AND gate circuits each having first and second inputs, the outputs of said gate circuits being coupled to corresponding individual switch means connected between said storage means and a corresponding electroluminescent element, said first AND gate inputs being coupled in common to the output of said logic circuit and said second AND gate inputs being coupled to respective display signal outputs of said clock circuit.

4. The apparatus according to claim 2, further comprising a secondary voltage source and means coupling said secondary source to the junction of said storage means and said photovoltaic source for supplying energy to said storage means when the voltage output of said photovoltaic source falls below a predetermined minimum level.

5. The apparatus according to claim 4, wherein said means coupling said secondary source to said storage means and photovoltaic source comprises a resistor.

6. The apparatus according to claim 2, further comprising:
    a secondary voltage source;
    second storage means for storing the output of said secondary voltage source;
    means for generating a second reference voltage level which is higher than the first reference voltage level;
    second comparator means for comparing the voltage output of said photovoltaic source with said second reference voltage and for generating a second logic output signal when the output voltage of said photovoltaic source is lower than said second reference voltage; and
    further logic circuit means coupled to the output of said second comparator means for coupling the output of said second storage means to said selected electroluminescent elements during the period of generation of said second logic output signal.

7. The apparatus according to claim 6, further comprising: detector means for detecting ambient illumination and for generating a signal proportional thereto; and a modulator coupled to and controlled by the output of said detector means; and wherein said further logic circuit means comprises an AND gate circuit having one input coupled to the output of said second comparator means, a second input coupled to the output of said modulator and an output coupled to a further switching means interposed between said second storage means and said electroluminescent elements.

8. The apparatus according to claim 1, further comprising: second storage means for storing electrical energy from a secondary voltage source; a second logic control circuit and switching means for connecting said second storage means to the electroluminescent elements when the ambient irradiation is weak, said switching means being disconnected when the irradiation of the photovoltaic source is sufficient for energizing the electroluminescent elements.

9. The apparatus according to claim 8, in which the first switching means comprises common switch means for disconnecting the first storage means from the second storage means at low illumination levels.

10. An electronic timepiece display apparatus controlled by a clock circuit generating a clock signal and including a decoder producing a plurality of display signals, the improvement comprising:
    a plurality of electroluminescent display elements;
    a photovoltaic battery generating electrical power as a function of the amount of ambient light irradiating said battery;
    storage means for storing the output power of said photovoltaic battery and delivering a voltage in relation to the stored energy;
    means for generating a reference voltage level;
    comparator means for comparing the voltage across said storage means with said reference voltage and for generating a logic output signal when the voltage across said storage means is greater than said reference voltage;
    logic means having inputs coupled to the logic output of said comparator means and to the clock signal output of said clock circuit, said logic means producing an output signal starting at the onset of said clock signal and vanishing at the end of said comparator output;

switching means inserted between the output of said storage means and each of said electroluminescent elements; and control means for selectively activating said switching means to couple said storage means to a number of selected electroluminescent elements to energize said elements selected by the display signals, said control means having first inputs coupled to the logic output of said logic means for automatic adjustment of the display brightness and second inputs coupled to the display outputs of said clock circuit for selecting the particular electroluminescent elements to be activated.

11. The apparatus according to claim 10, further comprising:

a second non-photovoltaic energy source; and coupling means between this secondary energy source and the storage means in order to provide a supplementary flow of energy to these storage means at low illumination level.

12. The apparatus according to claim 11, the coupling means between the second energy source and the storage means being a resistor in which the current flows from the secondary energy source to the storage means at low illumination levels, and flows from the storage means to the secondary energy source and recharges it at high illumination levels.

13. The apparatus according to claim 10, further comprising:

a secondary energy source;

second storage means for storing the output of said secondary energy source and delivering a voltage in relation to the stored energy;

means for generating a second reference voltage level which is higher than the first reference voltage level;

second comparator means for comparing the voltage output of said photovoltaic source with said second reference voltage and for generating a second logic output signal when the output voltage of said photovoltaic source is lower than said second reference voltage; and further logic and switching means controlled by the output of said second comparator means for coupling the output of said second storage means to said selected electroluminescent elements during the period of generation of said second logic output signal.

14. The apparatus according to claim 13, in which the logic means comprises an AND logical gate with two inputs, one of which is connected to the output of the second comparator through an inverter and the other of which is connected to the output of a modulator controlled by an ambient radiation detector, said AND circuit delivering an output signal controlling the second switching means inserted between said second storage means and the first switching means.

15. The apparatus according to claim 10, the control means for selectively activating said switching means comprising a single electronic switch controlled by the logic means and controlling the supply of power to the decoder.

* * * * *